US009805825B1

(12) United States Patent
Singh

(10) Patent No.: US 9,805,825 B1
(45) Date of Patent: Oct. 31, 2017

(54) MEMORY ERROR CAPTURE LOGIC

(71) Applicant: Apple Inc., Cupertino, CA (US)

(72) Inventor: Preminder Singh, Belmont, CA (US)

(73) Assignee: Apple Inc., Cupertino, CA (US)

(*) Notice: Subject to any disclaimer, the term of this patent is extended or adjusted under 35 U.S.C. 154(b) by 58 days.

(21) Appl. No.: 14/834,055

(22) Filed: Aug. 24, 2015

(51) Int. Cl.
*G11C 29/00* (2006.01)
*G11C 29/38* (2006.01)
*G11C 29/44* (2006.01)

(52) U.S. Cl.
CPC .............. *G11C 29/38* (2013.01); *G11C 29/44* (2013.01)

(58) Field of Classification Search
CPC ..... G11C 29/44; G11C 29/38; G11C 29/4401; G11C 2029/1208; G11C 29/72; G11C 29/14; G11C 29/32; G11C 2207/104; G11C 29/48; G11C 2029/3202; G11C 2029/0401; G01R 31/318508; G01R 31/318513; G01R 31/318541; G01R 31/318555; G01R 31/3187
See application file for complete search history.

(56) References Cited

U.S. PATENT DOCUMENTS

| | | | |
|---|---|---|---|
| 5,740,098 A | 4/1998 | Adams et al. | |
| 6,067,262 A * | 5/2000 | Irrinki | G11C 29/006 365/200 |
| 6,367,042 B1 * | 4/2002 | Phan | G01R 31/3187 714/733 |
| 6,510,530 B1 | 1/2003 | Wu et al. | |
| 6,563,751 B1 | 5/2003 | Wu | |
| 6,643,807 B1 * | 11/2003 | Heaslip | G11C 29/44 714/719 |
| 7,490,279 B1 * | 2/2009 | Kumar | G11C 29/14 714/719 |
| 8,418,010 B2 | 4/2013 | Rivoir | |
| 2002/0199136 A1 * | 12/2002 | Ku | G01R 31/3187 714/30 |
| 2004/0123200 A1 * | 6/2004 | Caty | G01R 31/31724 714/733 |
| 2004/0128596 A1 * | 7/2004 | Menon | G01R 31/318508 714/724 |
| 2006/0248414 A1 | 11/2006 | Dubey | |
| 2007/0047347 A1 * | 3/2007 | Byun | G11C 29/44 365/201 |

(Continued)

*Primary Examiner* — Guerrier Merant
(74) *Attorney, Agent, or Firm* — Meyertons, Hood, Kivlin, Kowert & Goetzel, P.C.; Gareth M. Sampson; Lawrence J. Merkel

(57) ABSTRACT

A built-in self test (BIST) may be performed on a device memory having two memory portions that are symmetrical (e.g., two symmetric halves of the device memory). The BIST may be run on the first memory portion. Error logic output from the first memory portion is captured (stored) in the second memory portion during the BIST run process. Error logic output from the first memory portion may include error data and an address of the memory error in the first memory portion. As the first and second memory portions are symmetric, the memory errors captured (stored) in the second memory portion are located at identical locations to the location of the memory errors in the first memory portion. A memory dump from the second memory portion after the BIST may provide a map of the memory errors in the first memory portion.

20 Claims, 3 Drawing Sheets

(56) References Cited

U.S. PATENT DOCUMENTS

| | | | | |
|---|---|---|---|---|
| 2007/0136626 A1* | 6/2007 | Chung | ............... | G11C 29/44 |
| | | | | 714/718 |
| 2008/0209283 A1* | 8/2008 | Gupta | ............... | G11C 29/44 |
| | | | | 714/718 |
| 2008/0235540 A1* | 9/2008 | Kobayashi | ......... | G11C 29/44 |
| | | | | 714/719 |
| 2010/0131812 A1* | 5/2010 | Mohammad | ........ | G11C 29/44 |
| | | | | 714/723 |
| 2013/0058145 A1* | 3/2013 | Yu | ..................... | G11C 29/50 |
| | | | | 365/49.17 |

\* cited by examiner

MEMORY ERROR CAPTURE LOGIC

BACKGROUND

1. Technical Field

Embodiments described herein relate to integrated circuit memory and testing memory. More particularly, embodiments described herein relate to the built-in self tests for memory and methods and logic circuits for testing memory.

2. Description of Related Art

Logging errors during high speed tests of memories using built-in self tests (BISTs) for integrated circuit memory (e.g., RAM or SRAM) may be process intensive. For example, a typical BIST for memory may run through the entire memory and it is possible that some memory failures may not be captured during the test. In some cases, memory failures may not be captured due to counter size limitations (e.g., the number of failures exceeds the size of the counter capturing the failures).

One example of a typical memory test (e.g., memory BIST) is a SONE (stop on nth error) test. In the SONE test, a start, capture, stop, start sequence is used to test the memory. After starting the test, the test is stopped at every error and error data is dumped from the memory. The test is then restarted after dumping the memory error information including any addressing information for the memory error. Thus, for n number of errors in the memory, the test is running n number of times. Running the test through the memory in this repeated manner is time consuming and increases the chances for inconsistent error capture information during the test.

Additionally, identifying the address of each memory error (e.g., determining address information) during the BIST may be complicated. For example, memory addresses may be cryptic in nature and there may be numerous steps to identifying a specific address for each memory error found during a single memory test. Correctly identifying each and every address may be difficult and error prone for a specific address for each memory error since memory addresses have complicated scrambling of address lines. Additional complexity may be introduced by the error data, which have further scrambling and multiplexing.

SUMMARY

In certain embodiments, a device includes memory that has been separated into at least two symmetric portions (e.g., a first memory portion and a second memory portion). In some embodiments, the symmetric portions comprise symmetric halves of the device memory. The first memory portion may be used as a memory under test while the second memory portion may be used as a capture memory. A memory error test such as a built-in self test (BIST) may be run on the first memory portion using one or more logic circuits located on the device and coupled to the memory portions.

In certain embodiments, error logic output is provided from the first memory portion upon a memory error instance in the first memory portion. The error logic output may include an error flag and error data. The error data may include an address of the memory error in the first memory portion. In certain embodiments, the error logic output is provided to the second memory portion as write enable (error flag) and write data (error data). The write data may be stored in the second memory location at the address given in the error data. Because the first memory portion and the second memory portion are symmetric, the error data is stored at a location in the second memory portion that is identical to the location of the memory error in the first memory portion.

In certain embodiments, after the memory error test is completed, a memory dump from the second memory portion is performed. Because of the symmetric locations of the error data in the second memory portion, the memory dump may include a map (e.g., a bitmap) of memory errors in the first memory portion. In some embodiments, the roles of first memory portion and second memory portion are swapped with the memory error test being run on the second memory portion and error data being captured in the first memory portion. In some embodiments, the device includes additional memory error test logic that runs other memory error tests on the memory and/or the memory portions. For example, the device may include additional memory error test logic for running a SONE test on the device memory.

BRIEF DESCRIPTION OF THE DRAWINGS

Features and advantages of the methods and apparatus of the embodiments described in this disclosure will be more fully appreciated by reference to the following detailed description of presently preferred but nonetheless illustrative embodiments in accordance with the embodiments described in this disclosure when taken in conjunction with the accompanying drawings in which.

Figure 1:
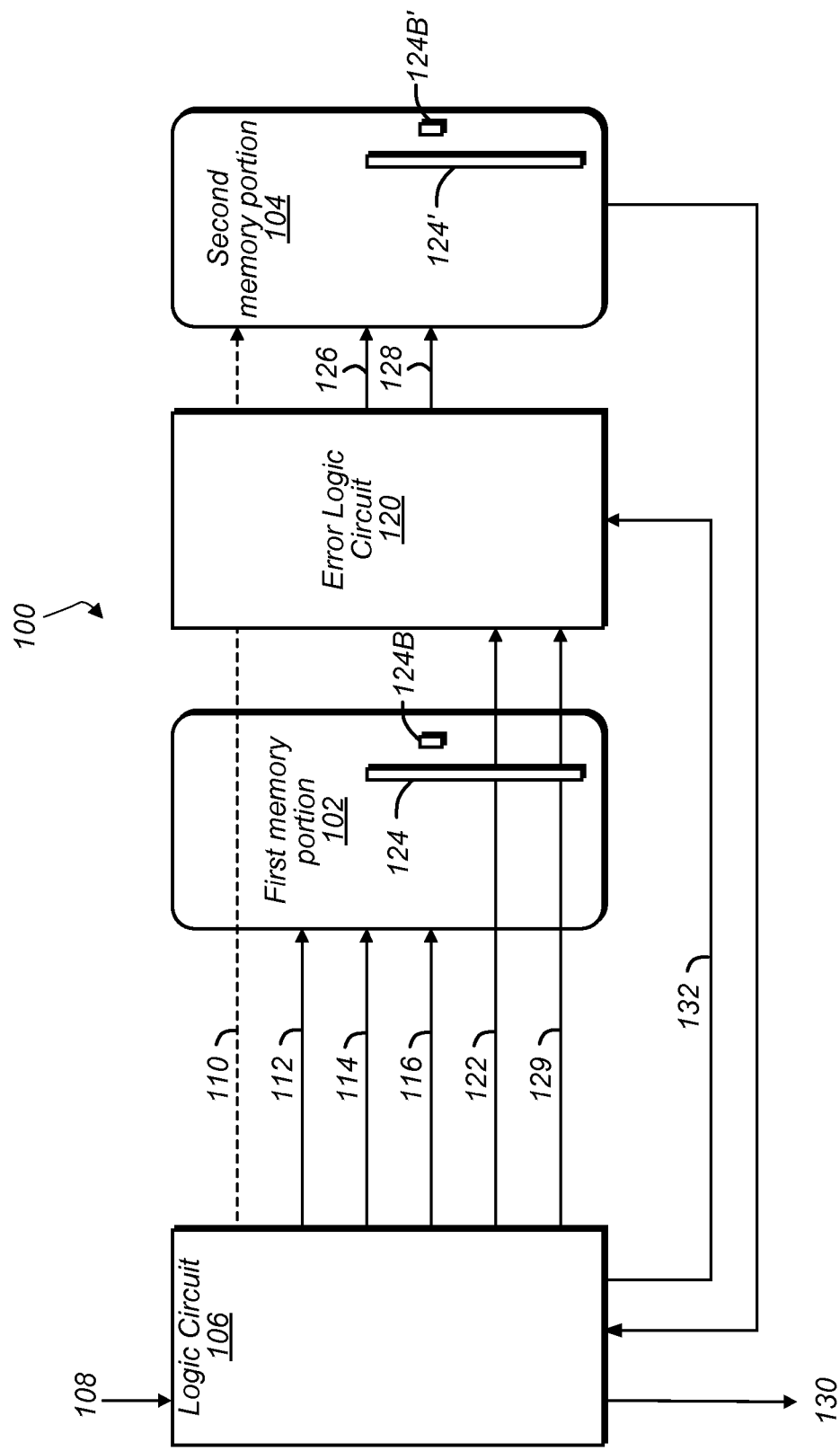
FIG. 1 depicts a representation of an embodiment of a memory block diagram of a device.

While embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. The hardware circuits may include any combination of combinatorial logic circuitry, clocked storage devices such as flops, registers, latches, etc., finite state machines, memory such as static random access memory or embedded dynamic random access memory, custom designed circuitry, programmable logic arrays, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112(f) interpretation for that unit/circuit/component.

In an embodiment, hardware circuits in accordance with this disclosure may be implemented by coding the description of the circuit in a hardware description language (HDL) such as Verilog or VHDL. The HDL description may be synthesized against a library of cells designed for a given integrated circuit fabrication technology, and may be modified for timing, power, and other reasons to result in a final design database that may be transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and may further include other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION OF EMBODIMENTS

This specification includes references to "one embodiment" or "an embodiment." The appearances of the phrases "in one embodiment" or "in an embodiment" do not necessarily refer to the same embodiment, although embodiments that include any combination of the features are generally contemplated, unless expressly disclaimed herein. Particular features, structures, or characteristics may be combined in any suitable manner consistent with this disclosure.

FIG. 1 depicts a representation of an embodiment of a memory block diagram of device 100. In certain embodiments, device 100 includes memory used in an integrated circuit device and/or memory located in a computer processor. In certain embodiments, device 100 includes memory that has a symmetric design and/or layout. For example, the memory may include, but not be limited to, random access memory (RAM) such as static RAM (SRAM). In certain embodiments, the memory in device 100 includes first memory portion 102 and second memory portion 104.

First memory portion 102 and second memory portion 104 may be formed by separating a memory into two or more portions. For example, in one embodiment, the memory is separated into two symmetric portions (e.g., first memory portion 102 and second memory portion 104 are symmetric). In certain embodiments, first memory portion 102 and second memory portion 104 are symmetric half portions of a memory. In some embodiments, first memory portion 102 and second memory portion 104 are other various portions of memory. For example, first memory portion 102 and second memory portion 104 may be mirrored portions, symmetric (or mirrored) banks of memory, or symmetric (or mirrored) memory instances (e.g., similar repeated patterns of memory).

In certain embodiments, device 100 includes logic circuit 106. Logic circuit 106 may be a test logic circuit such as a built-in self test (BIST) logic circuit for memory in device 100. Control signal 108 may be provided to logic circuit 106 from a memory controller or other device that controls or initiates function in the memory of device 100. Logic circuit 106 may share clock signal 110 with first memory portion 102 and second memory portion 104.

Figure 2:
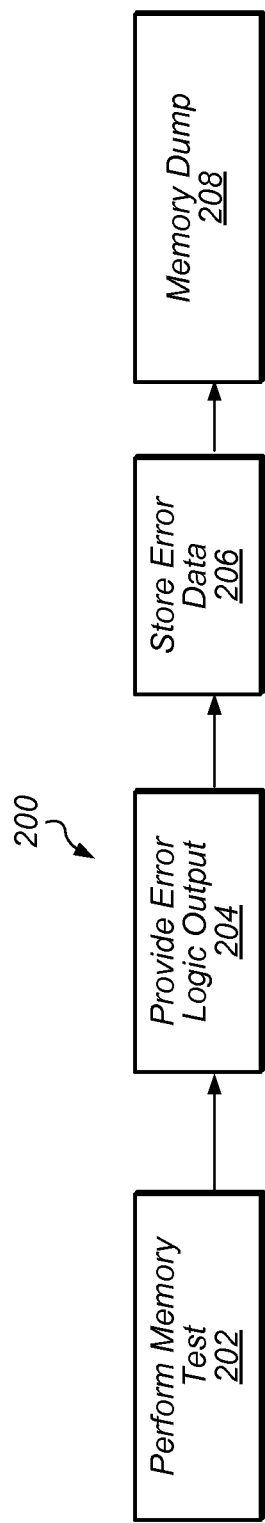
FIG. 2 depicts a flowchart of an embodiment of a memory test process.

In certain embodiments, logic circuit 106 receives control signal 108 as a "Run Test" signal (e.g., a "Run BIST" signal) and the logic circuit initiates a memory error test or memory test process on the memory in device 100 (e.g., the logic circuit initiates memory test process 200 depicted in FIG. 2). In certain embodiments, in response to the "Run" signal, logic circuit 106 initiates the memory error test on first memory portion 102.

In certain embodiments, the memory error test run on first memory portion 102 includes a march algorithm memory test. Examples of march algorithms that may be used in the memory error test include, but are not limited to, all zeros, all ones, a checkerboard pattern of zeroes and ones, or any other set of repeating patterns of zeroes and/or ones (including a regular repeating pattern or an irregular repeating pattern). In some embodiments, the memory error test includes other test algorithms known or contemplated in the art.

Logic circuit 106 may provide various signals to first memory portion 102 during the memory error test. For example, logic circuit 106 may provide address signal 112, write enable and read enable signal 114, and write data signal 116. Address signal 112 may include address information for first memory portion 102 (e.g., identify a bit location in the memory portion to write data). Write data signal 116 may include data to write to first memory portion 102 (e.g., "0" or "1" bit data).

First memory portion 102 may provide data signal 118 to error logic circuit 120. Data signal 118 may include read out data from first memory portion 102 (e.g., bit data and bit address information). In certain embodiments, error logic circuit 120 includes a comparator (e.g., a data comparator). Logic circuit 106 may provide comparator enable signal 122 to error logic circuit 120 and the comparator to initiate comparing of data in data signal 118 from data in write data signal 116 (e.g., check data from first memory portion 102 for errors).

During the memory error test, memory error 124, shown in FIG. 1, may be detected in first memory portion 102 (e.g., a "1" is stored instead of a "0") by the comparator in error logic circuit 120. Memory error 124 may be a read or write error in first memory portion 102. Memory errors 124 may have specific locations (addresses), as shown in FIG. 1. In certain embodiments, in the instance of memory error 124 in first memory portion 102 (as detected by the comparator in error logic circuit 120), the error data is flagged and the error logic circuit generates error logic output that includes the error flag and the error data. The error data may include an address of memory error 124 in first memory portion 102. In some embodiments, generation of error flags and error data includes pipelined error flag and error data generation.

After the error flag and the error data are generated for memory error 124, write enable signal 126 and write data signal 128 may be generated from the error logic output in error logic circuit 120. Write data signal 128 may include error data from memory error 124. The error data in write data signal 128 may include the address of memory error 124. In some embodiments, write enable signal 126 and write data signal 128 are provided after error logic circuit 120 receives export data signal 129 from logic circuit 106.

In certain embodiments, write enable signal 126 and write data signal 128 are provided to second memory portion 104. The error data from write data signal 128 may be stored (e.g., captured) in second memory portion 104. The error data may be stored as memory error 124'. The address of memory error 124' in second memory portion 104 may be assigned based on the error data provided in write data signal 128. For example, the address information for memory error 124 in the error data may be used as the address for memory error 124'. Because second memory portion 104 is symmetric to first memory portion 102, using the address information in the error data provides memory error 124' in the second memory portion with an identical address to memory error 124 in the first memory portion (e.g., the memory errors are written in the same bit location in the memory portions). Thus, memory errors 124, 124' are put at the same location in their respective memory portions without having to decrypt or interpret the address of the memory error in the first memory portion (e.g., the same address can be used in each memory portion).

The process of generating error logic output and writing/storing error data to second memory portion 104 may be repeated for each memory error instance (e.g., each memory error detected) in first memory portion 102. For example, memory error 124B may be an additional memory error in first memory portion 102 that is stored (captured) as memory error 124B' in second memory portion 104. Storing (capturing) memory errors in second memory portion 104 (e.g., memory errors 124' and 124B') at locations that are identical to the memory errors in first memory portion 102 (e.g., memory errors 124 and 124B) allows the second memory portion to be a virtual image of the errors found during the memory error test on the first memory portion (e.g., the second memory portion is a captured image of errors in the first memory portion). Thus, following the memory error test on first memory portion 102, second memory portion 104 provides a map (e.g., a bitmap) of the errors found during the memory error test.

In certain embodiments, logic circuit 106 performs memory dump 130 from second memory portion 104 after the memory error test. Memory dump 130 may be a slow speed memory dump compared to the speed at which the memory error test (e.g., the BIST) was run during the test process. Performing memory dump 130 at slow speed may reduce the likelihood of adding errors/failures to the data being dumped. Memory dump 130 may include reading out of all the data stored in second memory portion 104 (e.g., a scan out of all the contents of the second memory portion). Thus, memory dump 130 provides data that includes the map (e.g., bitmap) of memory errors in first memory portion 102 created by storing (capturing) errors in identical locations in second memory portion 104. In certain embodiments, memory dump 130 scans out an address which is descrambled and stored in a shadow register to provide a direct physical map of the location of memory errors.

In some embodiments, the roles of first memory portion 102 and second memory portion 104 are swapped. For example, the memory error test is performed on second memory portion 104 and first memory portion 102 is used to store (capture) a map of the memory errors in the second portion. In such embodiments, common circuitry in logic circuit 106 and/or error logic circuit 120 may be used in both directions to allow memory testing and capturing in either memory portion. In some embodiments, the roles of first memory portion 102 and second memory portion 104 are swapped after the memory error test is performed on the first memory portion. For example, logic circuit 106 may provide swap signal 132 to error logic circuit 120 to initiate swapping of the roles of first memory portion 102 and second memory portion 104.

Using memory portions 102, 104 and logic circuits 106, 120 (e.g., the embodiment of device 100 shown in FIG. 1) provides for storing (capturing) all the failures (e.g., memory errors) with only one run of a memory error test (e.g., BIST). Thus, the time for creating a map (e.g., bitmap) of the memory errors is reduced compared to memory error test capture methods that require the test to be run multiple times. Additionally, memory portions 102, 104 and logic circuits 106, 120 allow capture of memory errors without stalling or stopping the memory error test (e.g., the BIST) and the number of captures (e.g., stored memory error instances) can be as high as the size of the memory portions because of the symmetry between the memory portions. Thus, there is no counter size limitation that may cause a failure in the ability to count a memory error instance and most likely all memory error instances are captured during the memory error test. Without limits on the number of captures or counter size limitation and because of the reduced map generation time, memory portions 102, 104 and logic circuits 106, 120 may enable high volume mapping (e.g., bitmapping), which may be of added value for large memory caches. Thus, memory portions 102, 104 and logic circuits 106, 120 in the embodiment device 100 provide faster, more reliable, and more efficient generation of memory error maps (e.g., memory error bitmaps).

In addition, memory portions 102, 104 and logic circuits 106, 120 may allow for operation based mapping (e.g., operation based bitmapping). For example, a first memory error test may be conducted for a first operation (e.g., a march algorithm with a selected operation defined) and a first map created from a capture of the errors during the first memory error test. A second memory test may be conducted for a second operation (e.g., a march algorithm with a different selected operation defined) and a second map created from a capture of the errors during the second memory error test. The first map and the second map may reflect different results based on the first operation and the second operation having different parameters (e.g., the maps are based on the different operations used to create the maps).

FIG. 2 depicts a flowchart of an embodiment of memory test process 200. In certain embodiments, process 200 includes a memory test process or memory test run on device 100, shown in FIG. 1. As shown in FIG. 2, process 200 may include "Perform Memory Test 202". In 202, a memory error test, such as a built-in self test, may be run on a first memory portion of a memory (e.g., first memory portion 102 of device 100).

In certain embodiments, during the memory test, error logic output is provided from the first memory portion to a second memory portion (e.g., second memory portion 104) in "Provide Error Logic Output 204". In 204, error logic output may be provided from the first memory portion to the second memory portion in response to a memory error instance in the first memory portion. In certain embodiments, the first memory portion and the second memory portion are symmetric, as described above. In certain embodiments, the error logic output includes the error flag and the error data generated from the memory error in the first memory portion. The error data may include an address of the memory error in the first memory portion.

After the error logic output is provided to the second memory portion, the error data from the first memory portion may be stored in the second memory portion in "Store Error Data 206". In 206, the error data may be stored at a location in the second memory portion that has an identical address to the location of the error data in the first memory portion. In certain embodiments, 204 and 206 are repeated for each instance of a memory error while the memory test is run on the first memory portion.

After the memory test is completed on the first memory portion, a memory dump may be performed on the second memory portion in "Memory Dump 208". In 208, the memory dump may include reading out of all the data stored in the second memory portion. In some embodiments, the memory dump in 208 includes a map (e.g., bitmap) of memory errors in the first memory portion because the memory errors are stored in identical locations on the second memory portion. In some embodiments, process 200 is repeated by running the memory error test in 202 on the second memory portion. In such embodiments, error logic output is provided to the first memory portion in 204 and error data is stored in the first memory portion in 206. The memory dump is then performed on the first memory portion in 208.

In some embodiments, device 100, as shown in FIG. 1, includes additional logic circuits to logic circuit 106 and error logic circuit 120. The additional logic circuits may be used to run other memory error tests or memory error test processes on the memory in device 100 (e.g., first memory portion 102 and/or second memory portion 104). In some embodiments, the additional memory test is run on the memory in device 100 as a whole (e.g., the test runs through the entirety of the device memory). An example of an additional memory error test logic that may be included in device 100 includes, but is not limited to, a SONE test on the device memory.

In certain embodiments, one or more process steps described herein may be performed by one or more processors (e.g., a computer processor) executing instructions stored on a non-transitory computer-readable medium. For example, process 200, shown in FIG. 2, may have one or more steps performed by one or more processors executing instructions stored as program instructions in a computer readable storage medium (e.g., a non-transitory computer readable storage medium).

Figure 3:
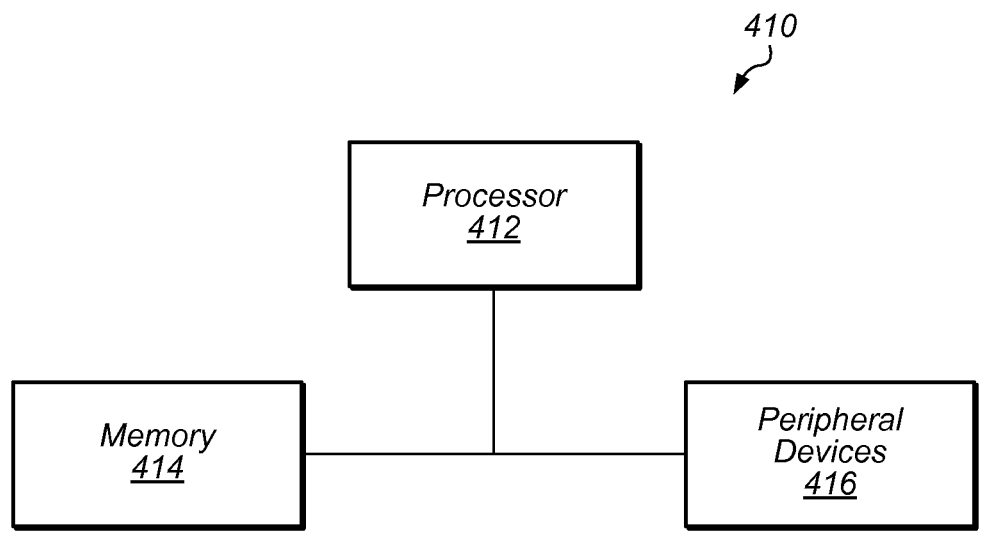
FIG. 3 depicts a block diagram of one embodiment of an exemplary computer system.

FIG. 3 depicts a block diagram of one embodiment of exemplary computer system 410. Exemplary computer system 410 may be used to implement one or more embodiments described herein. In some embodiments, computer system 410 is operable by a user to implement one or more embodiments described herein such as process 200, shown in FIG. 2. In the embodiment of FIG. 3, computer system 410 includes processor 412, memory 414, and various peripheral devices 416. Processor 412 is coupled to memory 414 and peripheral devices 416. Processor 412 is configured to execute instructions, including the instructions for process 200, which may be in software. In various embodiments, processor 412 may implement any desired instruction set (e.g. Intel Architecture-32 (IA-32, also known as x86), IA-32 with 64 bit extensions, x86-64, PowerPC, Sparc, MIPS, ARM, IA-64, etc.). In some embodiments, computer system 410 may include more than one processor. Moreover, processor 412 may include one or more processors or one or more processor cores.

Processor 412 may be coupled to memory 414 and peripheral devices 416 in any desired fashion. For example, in some embodiments, processor 412 may be coupled to memory 414 and/or peripheral devices 416 via various interconnect. Alternatively or in addition, one or more bridge chips may be used to coupled processor 412, memory 414, and peripheral devices 416.

Memory 414 may comprise any type of memory system. For example, memory 414 may comprise DRAM, and more particularly double data rate (DDR) SDRAM, RDRAM, etc. A memory controller may be included to interface to memory 414, and/or processor 412 may include a memory controller. Memory 414 may store the instructions to be executed by processor 412 during use, data to be operated upon by the processor during use, etc.

Figure 4:
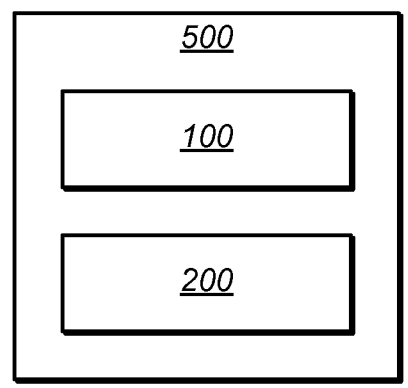
FIG. 4 depicts a block diagram of one embodiment of a computer accessible storage medium.

Peripheral devices 416 may represent any sort of hardware devices that may be included in computer system 410 or coupled thereto (e.g., storage devices, optionally including computer accessible storage medium 500, shown in FIG. 4, other input/output (I/O) devices such as video hardware, audio hardware, user interface devices, networking hardware, etc.).

Turning now to FIG. 4, a block diagram of one embodiment of computer accessible storage medium 500 including one or more data structures representative of device 100 (depicted in FIG. 1) included in an integrated circuit design and one or more code sequences representative of process 200 (shown in FIG. 2). Each code sequence may include one or more instructions, which when executed by a processor in a computer, implement the operations described for the corresponding code sequence. Generally speaking, a computer accessible storage medium may include any storage media accessible by a computer during use to provide instructions and/or data to the computer. For example, a computer accessible storage medium may include non-transitory storage media such as magnetic or optical media, e.g., disk (fixed or removable), tape, CD-ROM, DVD-ROM, CD-R, CD-RW, DVD-R, DVD-RW, or Blu-Ray. Storage media may further include volatile or non-volatile memory media such as RAM (e.g. synchronous dynamic RAM (SDRAM), Rambus DRAM (RDRAM), static RAM (SRAM), etc.), ROM, or Flash memory. The storage media may be physically included within the computer to which the storage media provides instructions/data. Alternatively, the storage media may be connected to the computer. For example, the storage media may be connected to the computer over a network or wireless link, such as network attached storage. The storage media may be connected through a peripheral interface such as the Universal Serial Bus (USB). Generally, computer accessible storage medium 500 may store data in a non-transitory manner, where non-transitory in this context may refer to not transmitting the instructions/data on a signal. For example, non-transitory storage may be volatile (and may lose the stored instructions/data in response to a power down) or non-volatile.

Further modifications and alternative embodiments of various aspects of the embodiments described in this disclosure will be apparent to those skilled in the art in view of this description. Accordingly, this description is to be construed as illustrative only and is for the purpose of teaching those skilled in the art the general manner of carrying out the embodiments. It is to be understood that the forms of the embodiments shown and described herein are to be taken as the presently preferred embodiments. Elements and materials may be substituted for those illustrated and described herein, parts and processes may be reversed, and certain features of the embodiments may be utilized independently, all as would be apparent to one skilled in the art after having the benefit of this description. Changes may be made in the elements described herein without departing from the spirit and scope of the following claims.

What is claimed is:

1. A method, comprising:
performing a memory error test on a single memory, wherein the single memory comprises a first memory portion and a second memory portion, the first memory portion and the second memory portion being symmetric, and wherein the memory error test is performed on the first memory portion of the single memory, the memory error test comprising a built-in self test in the single memory;
providing error logic output from the first memory portion to the second memory portion of the memory in response to a memory error instance in the first memory portion, wherein the error logic output comprises an error flag and error data, the error data including an address of a first location of the memory error in the first memory portion;
storing the error data from the first memory portion in the second memory portion using the address from the error data as an address of a second location of the stored error data in the second memory portion, whereby the second location in the second memory portion at which the error data is stored is identical to the first location of the memory error in the first memory portion; and
performing a memory dump from the second memory portion, wherein the memory dump comprises a map of memory errors in the first memory portion.

2. The method of claim 1, wherein the first memory portion and the second memory portion are formed by separating the single memory into at least two symmetric memory portions including at least the first memory portion and at least the second memory portion.

3. The method of claim 1, wherein the first memory portion comprises a first half of the single memory and the second memory portion comprises a second half of the single memory.

4. The method of claim 1, wherein the memory error test is initiated by a control signal provided to the single memory.

5. The method of claim 1, wherein the memory error test comprises a march algorithm.

6. The method of claim 1, wherein the memory dump from the second memory portion is performed at a speed slower than the memory error test.

7. The method of claim 1, wherein the memory dump comprises a read out of all data stored in the second memory portion.

8. The method of claim 1, further comprising:
performing a second memory error test on the second memory portion of the single memory;
providing second error logic output from the second memory portion to the first memory portion in response to a second memory error instance in the second memory portion, wherein the second error logic output comprises a second error flag and second error data, the second error data including an address of the second memory error in the second memory portion;
storing the second error data from the second memory portion in the first memory portion using the address from the second error data as an address of a second location of the stored second error data in the first memory portion, whereby the second location in the first memory portion at which the second error data is stored is identical to the first location of the second memory error in the second memory portion; and
performing a second memory dump from the first memory portion, wherein the second memory dump comprises a second map of memory errors in the second memory portion.

9. A device, comprising:
a memory separated into at least a first memory portion and a second memory portion, wherein the first memory portion and the second memory portion are symmetrical; and
a logic circuit configured to perform a memory error test on the first memory portion, wherein the memory error test comprises a built-in self test in the memory;
wherein the logic circuit is configured to provide error logic output from the first memory portion to the second memory portion in response to a memory error instance in the first memory portion during the memory error test, wherein the error logic output comprises an error flag and error data, the error data including an address of a first location of the memory error in the first memory portion;
wherein the logic circuit is configured to store the error data from the first memory portion in the second memory portion using the address from the error data as an address of a second location of the stored error data in the second memory portion, whereby the second location in the second memory portion at which the error data is stored is identical to the first location of the memory error in the first memory portion; and
wherein the logic circuit is configured to run the memory error test on the second memory portion and provide error logic output from the second memory portion to the first memory portion in response to a memory error instance in the second memory portion during the memory error test.

10. The device of claim 9, wherein the first memory portion and the second memory portion are symmetric half portions of the memory.

11. The device of claim 9, wherein the error data stored in the second memory portion is a map of individual memory errors in the first memory portion.

12. The device of claim 9, wherein the logic circuit is configured to receive a control signal to initiate the memory error test.

13. The device of claim 9, wherein the error data comprises a read or write error in the first memory portion.

14. The device of claim 9, wherein the memory comprises static memory.

15. A non-transient computer-readable medium including instructions that, when executed by one or more processors, causes the one or more processors to perform a method, comprising:
performing a memory error test on a single memory, wherein the single memory comprises a first memory portion and a second memory portion, the first memory portion and the second memory portion being symmetric, and wherein the memory error test is performed on the first memory portion of the single memory, the memory error test comprising a built-in self test in the single memory;

receiving error logic output from the first memory portion in response to a memory error instance in the first memory portion, wherein the error logic output comprises an error flag and error data, the error data including an address of a first location of the memory error in the first memory portion;

generating a write enable signal and write data signal for the second memory portion from the error logic output, wherein the write data signal comprises error data from the first memory portion;

providing the write enable signal and the write data signal to the second memory portion;

storing the error data from the first memory portion in the second memory portion using the address from the error data as an address of a second location of the stored error data in the second memory portion, whereby the second location in the second memory portion at which the error data is stored is identical to the first location of the memory error in the first memory portion; and performing a memory dump from the second memory portion, wherein the memory dump comprises a map of memory errors in the first memory portion.

16. The computer-readable medium of claim 15, wherein the first memory portion and the second memory portion are formed by separating the single memory into at least two symmetric memory portions, the symmetric memory portions comprising at least the first memory portion and at least the second memory portion.

17. The computer-readable medium of claim 15, wherein the memory error test comprises a single test of each memory address in the first memory portion.

18. The computer-readable medium of claim 15, wherein the error data comprises a read or write error in the first memory portion.

19. The computer-readable medium of claim 15, further comprising generating the write enable signal and write data signal using an error logic circuit coupled to the first memory portion and the second memory portion.

20. The computer-readable medium of claim 15, further comprising:

performing a second memory error test on the second memory portion of the single memory;

receiving second error logic output from the second memory portion in response to a second memory error instance in the second memory portion, wherein the second error logic output comprises a second error flag and second error data, the second error data including an address of a first location of the second memory error in the second memory portion;

generating a second write enable signal and second write data signal for the first memory portion of the memory from the second error logic output, wherein the second write data signal comprises second error data from the second memory portion;

providing the second write enable signal and the second write data signal to the first memory portion;

storing the second error data from the second memory portion in the first memory portion using the address from the second error data as an address of a second location of the stored second error data in the first memory portion, whereby the second location in the first memory portion at which the second error data is stored is identical to the first location of the second memory error in the second memory portion; and performing a second memory dump from the first memory portion, wherein the second memory dump comprises a second map of memory errors in the second memory portion.

* * * * *